United States Patent
Motomochi

(10) Patent No.: US 7,526,700 B2
(45) Date of Patent: Apr. 28, 2009

(54) SEMICONDUCTOR INTEGRATED CIRCUIT DEVICE

(75) Inventor: Kenji Motomochi, Osaka (JP)

(73) Assignee: Panasonic Corporation, Osaka (JP)

( * ) Notice: Subject to any disclaimer, the term of this patent is extended or adjusted under 35 U.S.C. 154(b) by 377 days.

(21) Appl. No.: 11/481,787

(22) Filed: Jul. 7, 2006

(65) Prior Publication Data

US 2007/0007985 A1 Jan. 11, 2007

(30) Foreign Application Priority Data

Jul. 7, 2005 (JP) ............................. 2005-198691

(51) Int. Cl.
*G01R 31/28* (2006.01)
(52) U.S. Cl. ...................................... 714/733; 714/718
(58) Field of Classification Search ................. 365/232, 365/200; 714/724, 719, 718, 733
See application file for complete search history.

(56) References Cited

U.S. PATENT DOCUMENTS

| 6,907,555 | B1 | 6/2005 | Nomura et al. |
| 7,174,489 | B2* | 2/2007 | Sadakata et al. ............. 714/719 |
| 2004/0062135 | A1* | 4/2004 | Itakura ........................ 365/232 |
| 2005/0149792 | A1* | 7/2005 | Furuyama .................... 714/724 |
| 2006/0015788 | A1 | 1/2006 | Yamazaki et al. |
| 2006/0083085 | A1* | 4/2006 | Ikegami ....................... 365/200 |

* cited by examiner

*Primary Examiner*—David Ton
(74) *Attorney, Agent, or Firm*—McDermott Will Emery LLP

(57) ABSTRACT

Provided are external input/output signal terminals, an interface circuit including a plurality of unit input/output circuits accompanying the respective signal terminals, a memory macro, a BIST (built-in self-test) circuit for performing a self test of the memory macro, and a logic circuit including a plurality of circuit blocks for generating various control signals. The unit input/output circuits are individually controlled by the various control signals. By externally controlling a specific one of the external input/output signal terminals, the logics of other external input/output signal terminals are individually controlled by the various internal signals.

13 Claims, 15 Drawing Sheets

FIG. 4

| | | IE | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| INPUT | IE | L | | | | | | | | | | | | | | | H | | | | | | | | | | | | | | |
| | PLDN | L | | | | | | | H | | | | | | | | L | | | | | | | H | | | | | | | |
| | PAD | L | | H | | Z | | X | | L | | H | | Z | | X | | L | | H | | Z | | X | | L | | H | | | | H |
| | NOE | L | H | L | H | L | H | L | H | L | H | L | H | L | H | L | H | L | H | L | H | L | H | L | H | L | H | L | H | | L | H |
| | IN | L | L | L | L | L | L | L | L | L | L | L | L | L | L | L | L | L | L | L | L | L | L | L | L | L | L | L | L | | L | L |
| OUTPUT | OUT | L | | H | | Z | | X | | L | H | | | | | | | L | | H | | L | X | X | | L | | H | | | | H |
| | PAD | L | | | | | | | | | | | | | | | | | | | | | | | | | | | | | | |

FIG. 14

| | | Standby (1) | WLBI operation (2) | Test/analysis of BIST&WLBI operation (3) | Test/analysis of DMA operation (4) |
|---|---|---|---|---|---|
| INPUT | STB1P_PAD | H | | | L |
| | BISTMODE_PAD | Z | Z | Z | Z |
| | AD0_NW_PAD | Z | Z | H | Z |
| | AD17_PAD | Z | Z | Z | Z |
| | NOE1_PAD | Z | L Z H L Z H | Z | L Z H L Z H |
| | NOE2_PAD | Z | L Z H L Z H | L Z H L Z H | L Z H L Z H |
| | DIO0_GO_PAD | Z | L X Z | Z | Z |
| | DIO15_PAD | Z | Z | Z | Z |
| | CLK_PAD | Z | Z | Z | Z |
| | RESET_PAD | Z | Z | Z | Z |
| OUTPUT | STB1P_PAD | H | | | L |
| | BISTMODE_PAD | L | L | L | L |
| | AD0_NW_PAD | L | L | H | Z |
| | AD17_PAD | L | L | Z | Z |
| | NOE1_PAD | L | L Z H L Z H | L | L Z H L Z H |
| | NOE2_PAD | L | L X Z X Z | L | L X Z X Z |
| | DIO0_GO_PAD | L | L | L | L |
| | DIO15_PAD | L | Z | Z | Z |
| | CLK_PAD | L | Z | Z | Z |
| | RESET_PAD | L | Z | Z | Z |

US 7,526,700 B2

SEMICONDUCTOR INTEGRATED CIRCUIT DEVICE

BACKGROUND OF THE INVENTION

The present invention relates to a semiconductor integrated circuit device including one or more memory macros and a self-testing block for testing the one or more memory macros.

As the integration levels and functionality in system LSIs have been increased, the capacity of incorporated memories has been continuously increasing year after year and built-in self-test (BIST) technique, as the means for testing these memories, has been growing in importance. BISA (built-in self-analyzer), BISR (built-in self-repair) and the like are also known as techniques for realizing a higher level of self-testing.

In recent years, it has also been required to efficiently perform wafer level burn-in (WLBI) tests, reliability tests, failure analysis, and the like.

According to the technique in U.S. Pat. No. 6,907,555, a self test is conducted by using a relatively small number of input/output terminals, which is desirable particularly when a WLBI test is performed.

Examples of a reliability test, such as test and analysis and life test, of a semiconductor integrated circuit device include various kinds of tests and analyses ranging from defective/non-defective selection to a continuous accelerated operation test, such as a WLBI test, performed for a specified length of time, specification analysis of malfunctioning part, detailed analysis of unstable operation, analysis of an abnormal condition occurring in standby current, and the like. And it is difficult to perform these tests and analyses with the maximum efficiency.

SUMMARY OF THE INVENTION

It is therefore an object of the present invention to provide a semiconductor integrated circuit device that includes means for optimally controlling each of a plurality of external control terminals particularly in order to perform a WLBI test, reliability test, failure analysis and the like with efficiency.

In order to achieve the object, an inventive semiconductor integrated circuit device includes a plurality of external input/output signal terminals; a plurality of unit input/output circuits accompanying the respective external input/output signal terminals; one or more memory macros; a self-testing block for performing a self test of the one or more memory macros within a chip; and a plurality of circuit blocks for generating various control signals, wherein the unit input/output circuits are individually controlled by the various control signals and include means for individually controlling, by externally controlling a specific one of the external input/output signal terminals, logics of other two or more of the external input/output signal terminals by the various internal signals.

According to the present invention, the number of externally controlled input/output terminals is controlled optimally in accordance with a plurality of operation modes or standby mode, such that a plurality of test and analysis modes can be set, while in a test focusing on operation inside the memory macro, a test can be conducted in an operation in which factors causing the occurrence of malfunctions outside the memory macro are reduced. And test and analysis and the like in each test mode can thus be performed easily and efficiently.

BRIEF DESCRIPTION OF THE DRAWINGS

FIG. 4 is a second operation logic chart for the unit input/output circuit shown in FIG. 2.

FIG. 14 is a logic chart for external input/output signal terminals in the circuit configuration shown in FIG. 1.

DETAILED DESCRIPTION OF THE INVENTION

Hereinafter, embodiments of the present invention will be described with reference to the accompanying drawings.

Figure 1:
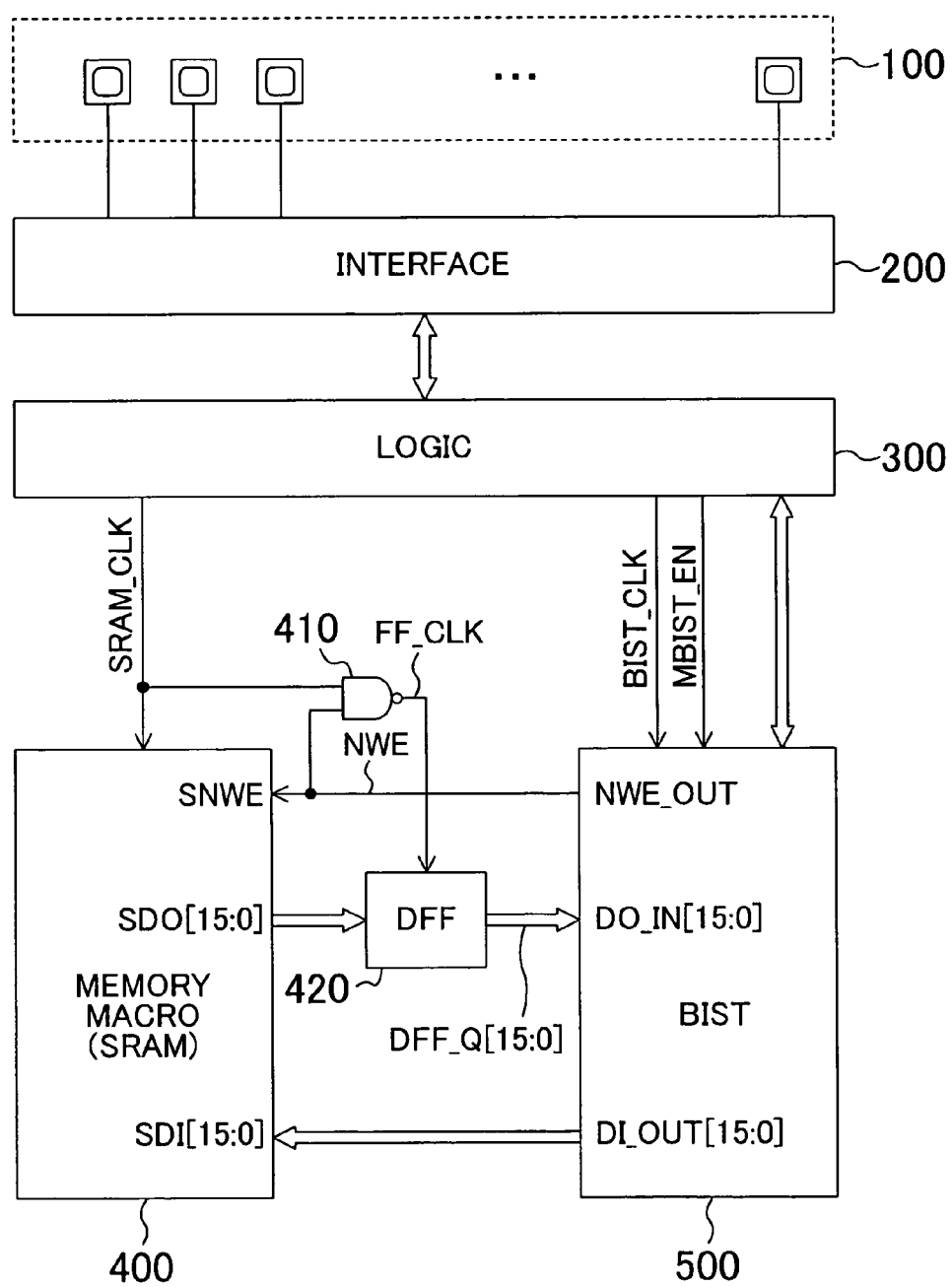
FIG. 1 is a diagram illustrating the circuit configuration of a semiconductor integrated circuit device according to an embodiment of the present invention.

FIG. 1 is a diagram illustrating the circuit configuration of a semiconductor integrated circuit device according to an embodiment of the present invention. In FIG. 1, the reference numeral 100 refers to external input/output signal terminals; 200 to an interface circuit including a plurality of unit input/output circuits; 300 to a logic circuit including first to sixth circuit blocks which will be described later; 400 to a memory macro (SRAM); 410 to a NAND element; 420 to a DFF circuit (a group of data latch circuits); and 500 to a BIST circuit. The BIST circuit 500 receives a self-test start signal MBIST_EN and a BIST clock signal BIST_CLK and includes: an NWE_OUT terminal and DI_OUT[15:0] terminals for outputting various types of signals that are input into the memory macro 400; and other thermals such as DO_IN [15:0] terminals for receiving a latched data output signal from the memory macro 400. The memory macro 400 receives an SRAM clock signal SRAM_CLK and includes: an SNWE terminal and SDI[15:0] terminals for inputting various types of signals output from the BIST circuit 500; and data output terminals SDO[15:0]. The signals output from NWE_OUT and DI_OUT[15:0] in the BIST circuit 500 are connected with SNWE and SDI[15:0] in the memory macro 400, respectively. The DFF circuit 420 receives a data output signal output from the SDO[15:0] terminals in the memory macro 400 and outputs from the data output terminals thereof a data output signal that is input into the DO_IN[15:0] terminals in the BIST circuit 500. And to a clock input terminal in the DFF circuit 420, a NAND logic signal of the NWE signal output from the NWE_OUT terminal of the BIST circuit 500 and the SRAM_CLK signal is input as a latch clock signal FF_CLK.

Figure 2:
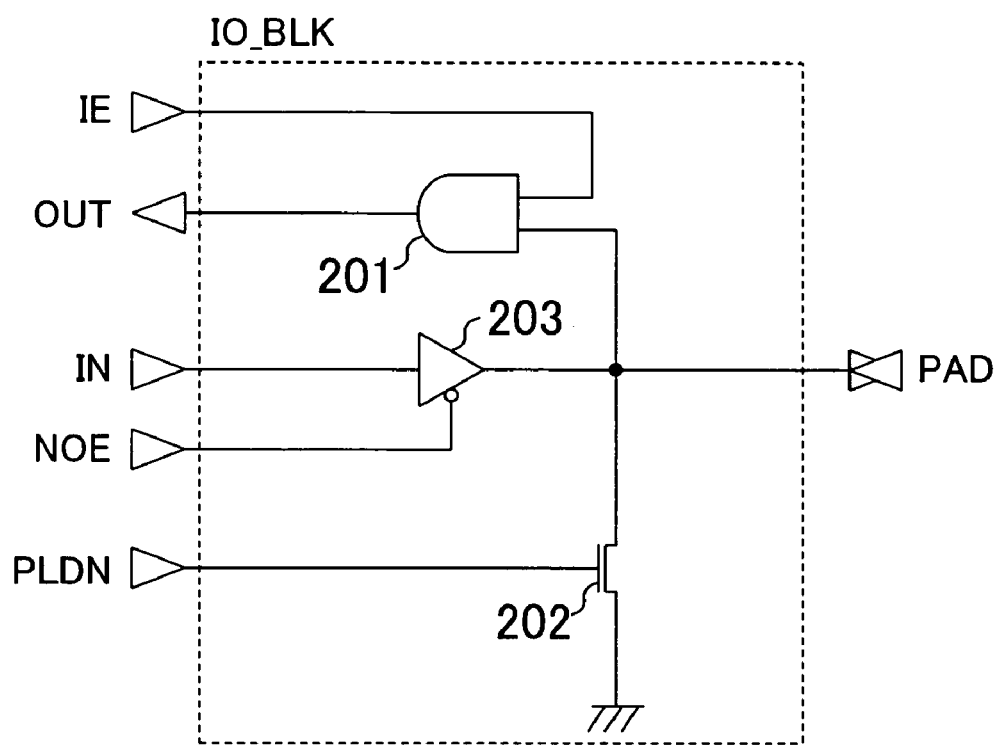
FIG. 2 is a diagram illustrating the circuit configuration of each of a plurality of unit input/output circuits included in an interface circuit shown in FIG. 1.

FIG. 2 is a diagram illustrating the circuit configuration of each of the unit input/output circuits IO_BLK included in the interface circuit 200 shown in FIG. 1. Each unit input/output circuit IO_BLK includes a plurality of input terminals IE, IN, NOE, and PLDN, one output terminal OUT, and one input/output terminal PAD. The input control terminal IN is connected with a data input terminal in a tri-state buffer 203, the output enable terminal NOE is connected with a control terminal in the tri-state buffer 203, and an output terminal in the tri-state buffer 203 is connected with the input/output terminal PAD. The pull-down control terminal PLDN is connected with the gate of a pull-down transistor 202, while the source of the pull-down transistor 202 is grounded and the drain of the pull-down transistor 202 is connected with the input/output terminal PAD. The input enable terminal IE is connected with one input gate of an AND element 201, the input/output terminal PAD is connected with the other input gate, and the output terminal OUT is connected with an output terminal in the AND element 201.

Figure 3:
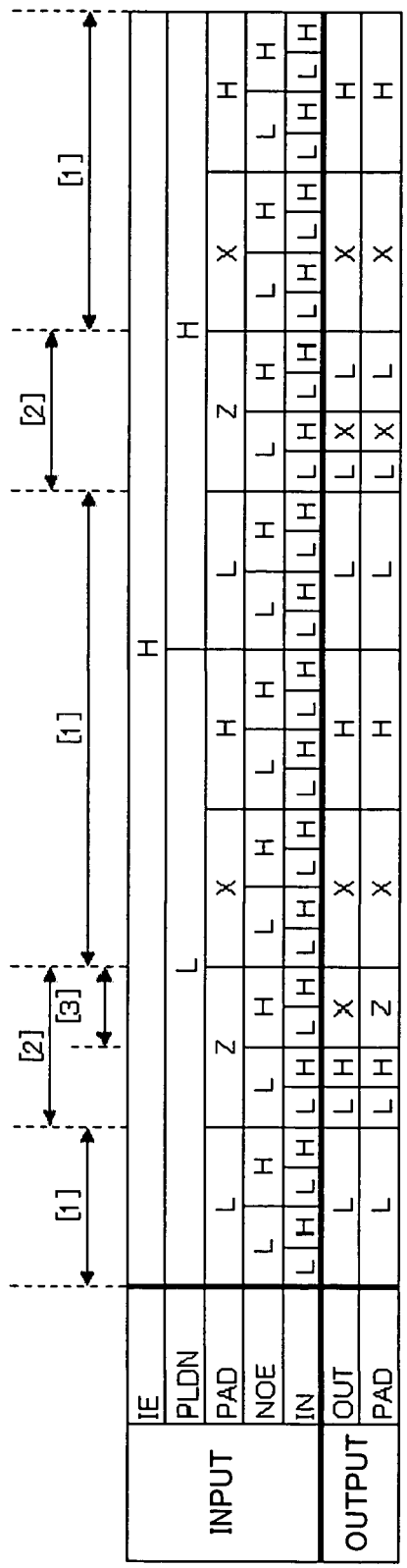
FIG. 3 is a first operation logic chart for the unit input/output circuit shown in FIG. 2.
Figure 5:
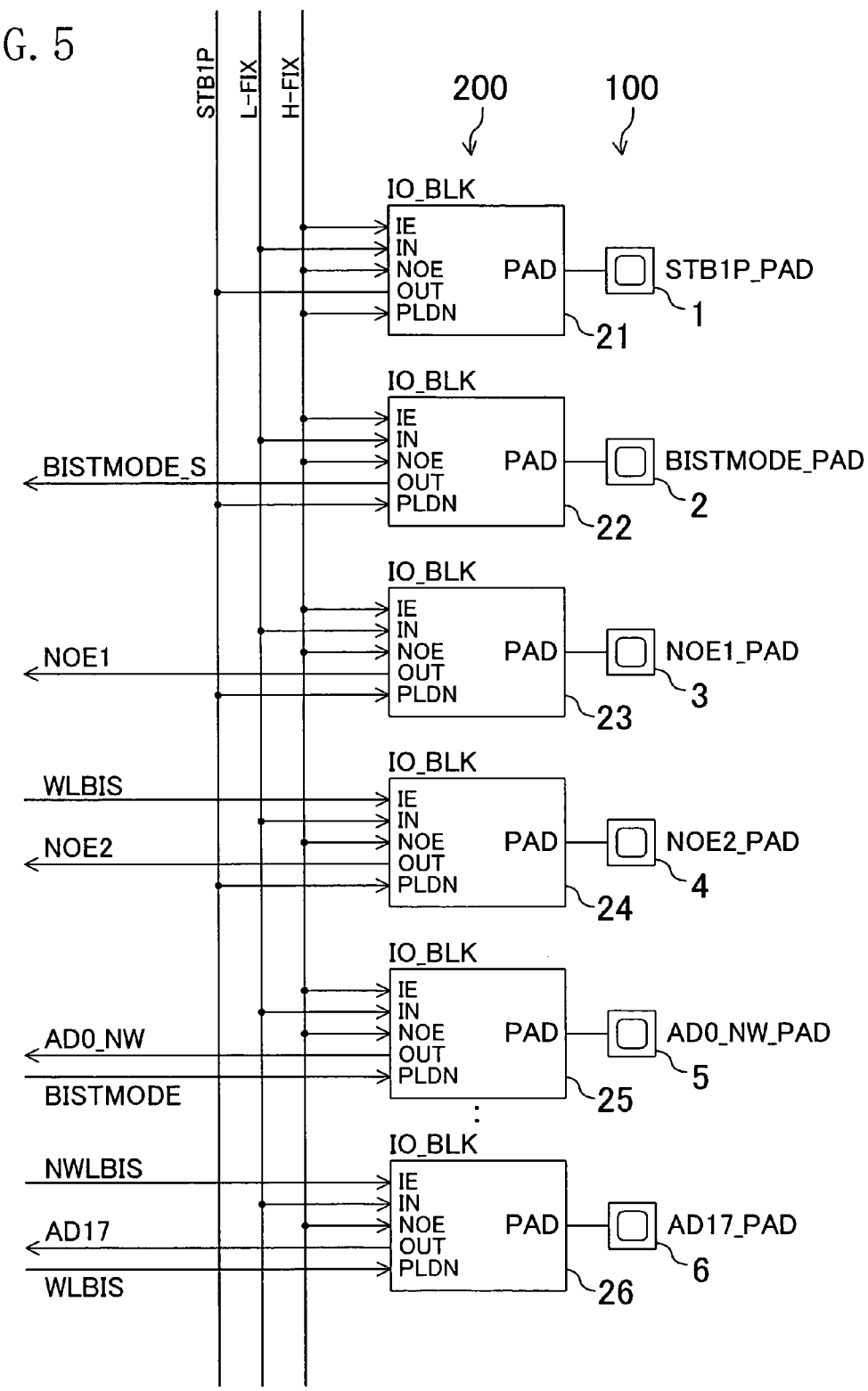
FIG. 5 is a diagram illustrating the detailed circuit configuration of part of the interface circuit shown in FIG. 1.
Figure 6:
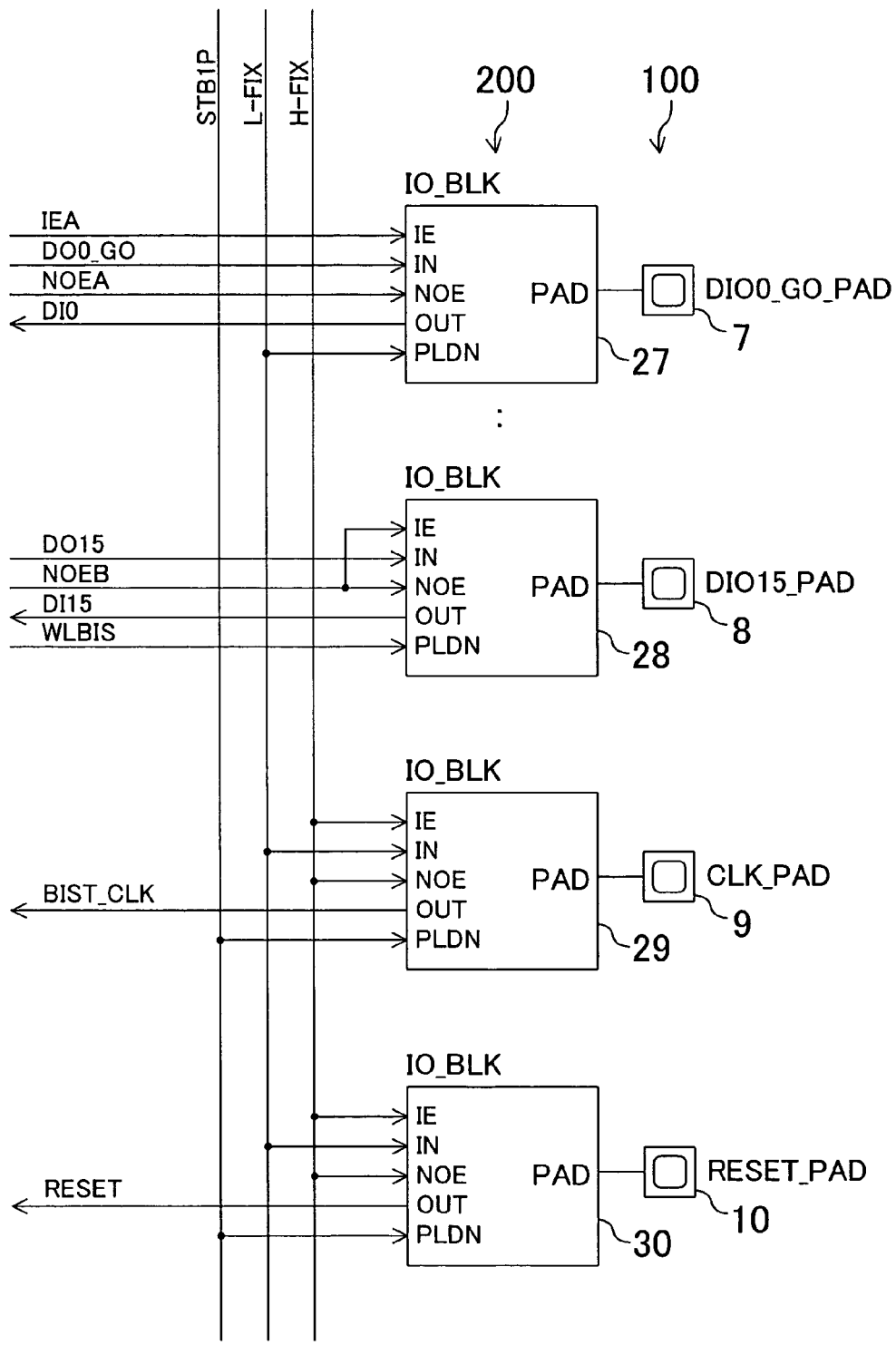
FIG. 6 is a diagram illustrating the detailed circuit configuration of another part of the interface circuit shown in FIG. 1.
Figure 7:
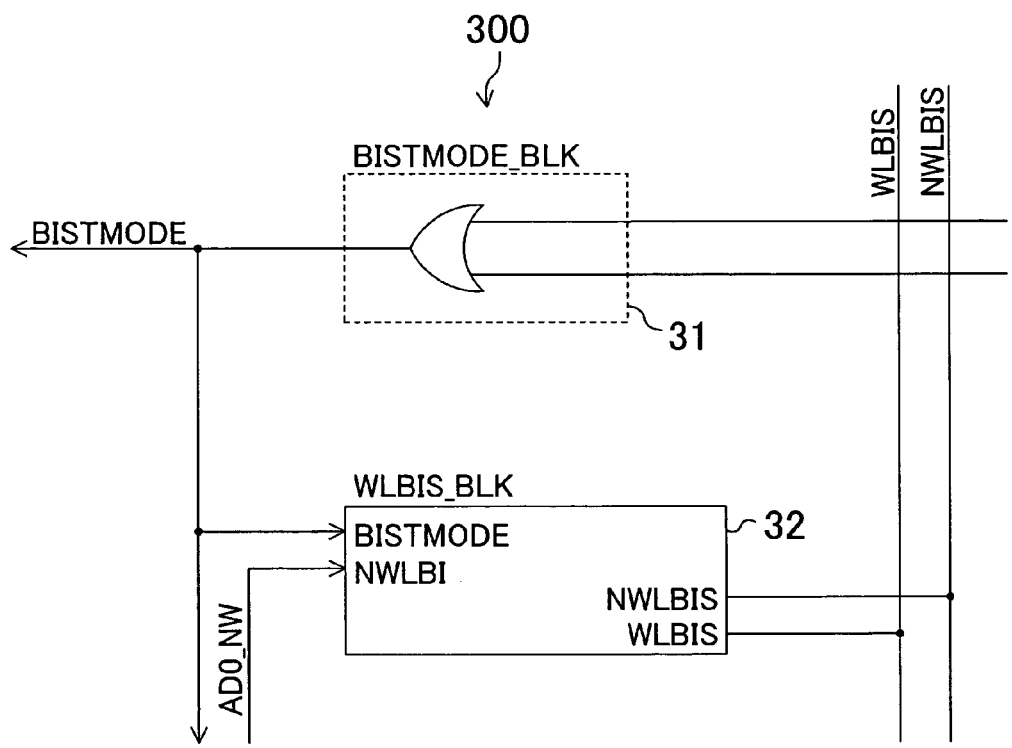
FIG. 7 is a diagram illustrating the detailed circuit configuration of part of a logic circuit shown in FIG. 1.
Figure 8:
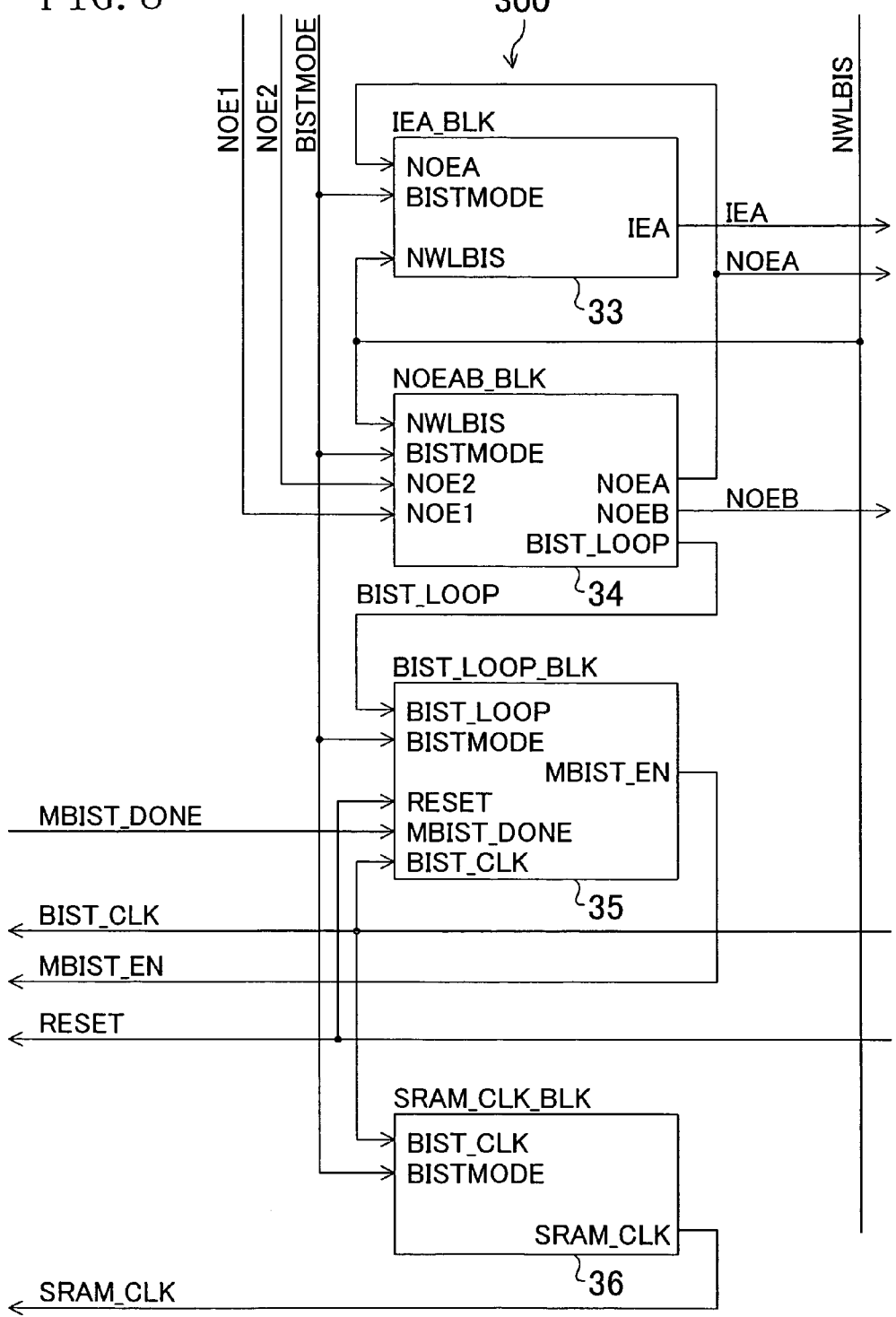
FIG. 8 is a diagram illustrating the detailed circuit configuration of another part of the logic circuit shown in FIG. 1.

FIG. 3 is a first operation logic chart for the unit input/output circuit IO_BLK shown in FIG. 2. The first operation logic chart shows how the logics of the output terminal OUT and the input/output terminal PAD change when the input control terminal IE is in the "H" state and the other terminals PLDN, PAD, NOE, and IN are set to various logics. Among these, worthy of note are the input logic of the PAD terminal and the output logics of the OUT terminal and the PAD terminal, because they include not only the logics "L" and "H" but also states "X" and "Z". If the input logic of the PAD terminal is "Z", it means that the PAD terminal is in the open state. If the input logic of the PAD terminal is "X", it indicates a state in which an unknown logic signal is applied to the PAD terminal. Furthermore, if the output logics of the OUT and PAD terminals are "Z", it means an output Hi-Z (high impedance) state. If the output logics of the OUT and PAD terminals are "X", it indicates a state in which an unknown logic signal is output.

The numerals [1] to [3] shown in the upper portion of FIG. 3 represent logic combination segments provided for purposes of explanation. The logic combination segments [1] indicate a case in which "L", "H", or "X" is externally applied to the PAD terminal. In this case, the OUT terminal and the PAD terminal both output the same logic as the PAD terminal. The logic combination segments [2] indicate a case in which the PAD terminal is in the "Z" state, that is, in the open state. In this case, the logics of the OUT and PAD terminals are determined by the logic states of the input terminals other than the PAD terminal. The logic combination segment [3], which is a certain logic combination segment in the logic combination segments [2], indicates that when IE is in the "H" state, PLDN is in the "L" state, NOE is in the "H" state, PAD is in the "Z" state, and IN is in the "L" or "H" state, the OUT terminal will be in the "X" state and the PAD terminal will be in the "Z" state.

FIG. 4 is a second operation logic chart for the unit input/output circuit IO_BLK shown in FIG. 2. The second operation logic chart shows how the logics of the output terminal OUT and the input/output terminal PAD change when the input control terminal IE is in the "L" state and the other terminals PLDN, PAD, NOE, and IN are set to various logics. When the input control terminal IE is in the "L" state, the OUT terminal is always in the "L" state. The output logic of the PAD terminal is the same as shown in FIG. 3.

FIGS. 5 to 8 illustrate exemplary detailed configurations of the interface circuit 200 and the logic circuit 300 shown in FIG. 1. The external input/output signal terminals 100 include ten terminals 1 to 10. The interface circuit 200 includes unit input/output circuits (IO_BLK) 21 to 30 which accompany the respective external input/output signal terminals 1 to 10. As described above, the unit input/output circuits (IO_BLK) 21 to 30 each include a plurality of input terminals IE, IN, NOE, and PLDN, one output terminal OUT, and one input/output terminal PAD, and are individually controlled by the respective most suitable signals. "H-FIX" is a signal that is always fixed at the logic "H", while "L-FIX" is a signal that is always fixed at the logic "L". For instance, in the unit input/output circuit 25 whose PAD terminal is connected with AD0_NW_PAD, the IE terminal and the NOE terminal are connected with an H-FIX signal, the IN terminal is connected with an L-FIX signal, the OUT terminal is connected with an AD0_NW signal, and the PLDN terminal is connected with a BISTMODE signal.

During standby mode, only the specific input/output signal terminal (STB1P_PAD) 1 is an externally connected control terminal and the other input/output signal terminals 2 to 10 are externally non-connected terminals. During a WLBI operation, BISTMODE_PAD, NOE1_PAD, NOE2_PAD, DIO0_GO_PAD, CLK_PAD, and RESET_PAD are externally connected control terminals and the other input/output signal terminals are externally non-connected terminals. During the operations other than the WLBI operation, STB1P_PAD is an externally non-connected terminal, NOE2_PAD is a don't care terminal, and the other input/output signal terminals are externally connected control terminals.

The logic circuit 300 includes: a first circuit block (BISTMODE_BLK) 31 for generating a main operation mode setting signal BISTMODE; a second circuit block (WLBIS_BLK) 32 for generating a sub-operation mode setting signal WLBIS; a third circuit block (IEA_BLK) 33 for generating an input enable signal IEA for the given unit input/output circuit 21; a fourth circuit block (NOEAB_BLK) 34 for generating a repeated operation control signal BIST_LOOP and the like; a fifth circuit block (BIST_LOOP_BLK) 35 for generating a self-test start signal MBIST_EN which is input into the BIST circuit 500; and a sixth circuit block (SRAM-CLK_BLK) 36 for generating an SRAM_CLK signal which is input into the memory macro 400. It should be noted that the semiconductor integrated circuit device shown in FIG. 1 includes a plurality of input/output signal terminals and a plurality of circuit blocks, which are not shown, in addition to the above-described members.

The first circuit block 31 receives an output signal STB1P, which is output from the OUT terminal of the unit input/output circuit 21 whose PAD terminal is connected with the external input terminal STB1P_PAD, and an output signal BISTMODE_S, which is output from the OUT terminal of the unit input/output circuit 22 whose PAD terminal is connected with the external input terminal BISTMODE_PAD, and generates the OR logic signal BISTMODE of the STB1P signal and the BISTMODE_S signal.

The second circuit block 32 receives the BISTMODE signal and the output signal AD0_NW, which is output from the OUT terminal of the unit input/output circuit 25 whose PAD terminal is connected with the external input terminal AD0_NW_PAD, and generates the WLBIS signal and the inverted logic signal NWLBIS of the WLBIS signal.

The third circuit block 33 receives the BISTMODE signal, the NWLBIS signal, and an output signal NOEA produced from the fourth circuit block 34 and generates the IEA signal for controlling the IE terminal of the unit input/output circuit 27 whose PAD terminal is connected with the external input terminal DIO0_GO_PAD.

The fourth circuit block 34 receives the BISTMODE signal, the NWLBIS signal, an output signal NOE1, which is output from the OUT terminal of the unit input/output circuit 23 whose PAD terminal is connected with the external input terminal NOE1_PAD, and an output signal NOE2, which is output from the OUT terminal of the unit input/output circuit 24 whose PAD terminal is connected with the external input terminal NOE2_PAD, and outputs the NOEA signal, the NOEB signal, and the BIST_LOOP signal. The NOEA signal controls the NOE terminal of the unit input/output circuit 27 whose PAD terminal is connected with the external input terminal DIO0_GO_PAD, while being input into the third circuit block 33. The NOEB signal controls the NOE terminal of the unit input/output circuit 28 whose PAD terminal is connected with the external input terminal DIO15_PAD. The BIST_LOOP signal is input into the fifth circuit block 35.

The fifth circuit block 35 receives the output signal BIST_LOOP from the fourth circuit block 34, the BISTMODE signal, a self-test completion signal MBIST_DONE output from the BIST circuit 500, an output signal BIST_CLK from the OUT terminal of the unit input/output circuit 29 whose PAD terminal is connected with the external input terminal CLK_PAD, and an output signal RESET from the OUT terminal of the unit input/output circuit 30 whose PAD terminal is connected with the external input terminal RESET_PAD, and outputs the self-test start signal MBIST_EN, which is input into the BIST circuit 500.

The sixth circuit block 36 receives the BIST_CLK signal and the BISTMODE signal and generates the SRAM_CLK signal, which is input into the memory macro 400.

Figure 9:
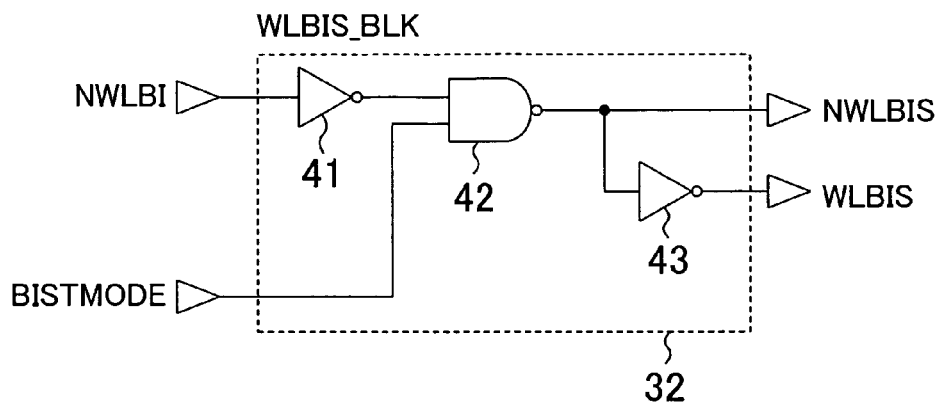
FIG. 9 is a diagram illustrating the circuit configuration of a second circuit block shown in FIG. 7.

FIG. 9 is a diagram illustrating the circuit configuration of the second circuit block 32. The second circuit block 32 includes input terminals BISTMODE and NWLBI and output terminals WLBIS and NWLBIS. BISTMODE is connected to one input gate of a NAND element 42. NWLBI is connected to the other input gate of the NAND element 42 through an inverter element 41. The output of the NAND element 42 is connected with NWLBIS and also connected with WLBIS by way of another inverter element 43. When BISTMODE is in the "L" state, WLBIS goes to the "L" state and NWLBIS goes to the "H" state irrespective of the logic of NWLBI. When BISTMODE is in the "H" state, the logic states of WLBIS and NWLBIS change as follows: If NWLBI is in the "L" state, WLBIS goes to the "H" state and NWLBIS goes to the "L" state, and if NWLBI is in the "H" state, WLBIS goes to the "L" state and NWLBIS goes to the "H" state.

Figure 10:
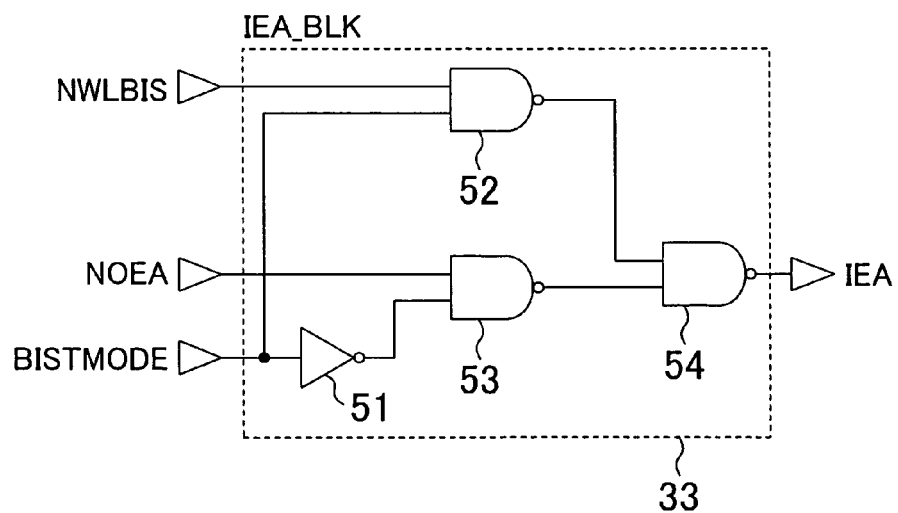
FIG. 10 is a diagram illustrating the circuit configuration of a third circuit block shown in FIG. 8.

FIG. 10 is a diagram illustrating the circuit configuration of the third circuit block 33. The third circuit block 33 includes input terminals BISTMODE, NOEA, and NWLBIS and an output terminal IEA. BISTMDOE is connected to one input gate of a first NAND element 52 and also connected to one input gate of a second NAND element 53 through an inverter element 51. NOEA is connected with the other input gate of the second NAND element 53. NWLBIS is connected with the other input gate of the first NAND element 52. The output of the first NAND element 52 is connected with one input gate of a third NAND element 54. The output of the second NAND element 53 is connected with the other input gate of the third NAND element 54. The output of the third NAND element 54 is connected with IEA. When BISTMODE is in the "L" state, the logic of IEA changes irrespective of the logic of NWLBIS in the following manner: if NOEA is in the "L" state, IEA goes to the "L" state and if NOEA is in the "H" state, IEA goes to the "H" state. When BISTMODE is in the "H" state, the logic of IEA changes irrespective of the logic of NOEA in the following manner: if NWLBIS is in the "L" state, IEA goes to the "L" state and if NWLBIS is in the "H" state, IEA goes to the "H" state.

Figure 11:
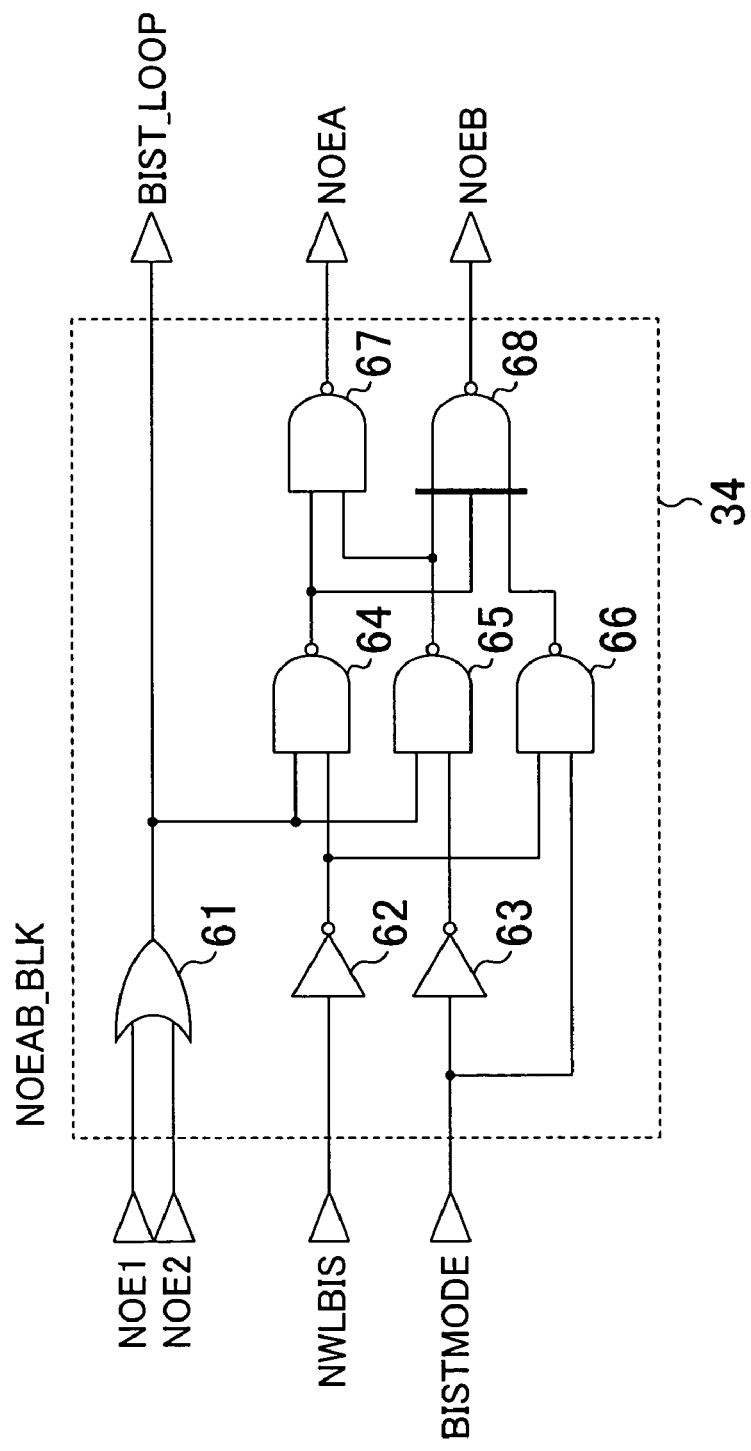
FIG. 11 is a diagram illustrating the circuit configuration of a fourth circuit block shown in FIG. 8.

FIG. 11 is a diagram illustrating the circuit configuration of the fourth circuit block 34. The fourth circuit block 34 includes input terminals BISTMODE, NWLBIS, NOE1, and NOE2 and output terminals BIST_LOOP, NOEA, and NOEB. In the fourth circuit block 34, a plurality of logic elements form a combinational circuit. In FIG. 11, the reference numeral 61 refers to an OR element; 62 and 63 to inverter elements; and 64, 65, 66, 67, and 68 to NAND elements. When BISTMODE is in the "L" state, the logics of BIST_LOOP, NOEA, and NOEB change irrespective of the logic of NWLBIS in the following manner: if NOE1 and NOE2 are both in the "L" state, all of BIST_LOOP, NOEA, and NOEB go to the "L" state, and if either NOE1 or NOE2 is in the "H" state, all of BIST_LOOP, NOEA, and NOEB go to the "H" state. When BISTMODE is in the "H" state and NWLBIS is in the "L" state, the logics of BIST_LOOP and NOEA change in such a manner that if NOE1 and NOE2 are both in the "L" state, BIST_LOOP and NOEA go to the "L" state and if either NOE1 or NOE2 is in the "H" state, BIST_LOOP and NOEA go to the "H" state. And NOEB is always in the "H" state. When BISTMODE is in the "H" state and NWLBIS is in the "H" state, the logic of BIST_LOOP changes in such a manner that if NOE1 and NOE2 are both in the "L" state, BIST_LOOP goes to the "L" state and if either NOE1 or NOE2 is in the "H" state, BIST_LOOP goes to the "H" state. And NOEA and NOEB are always in the "L" state.

Figure 12:
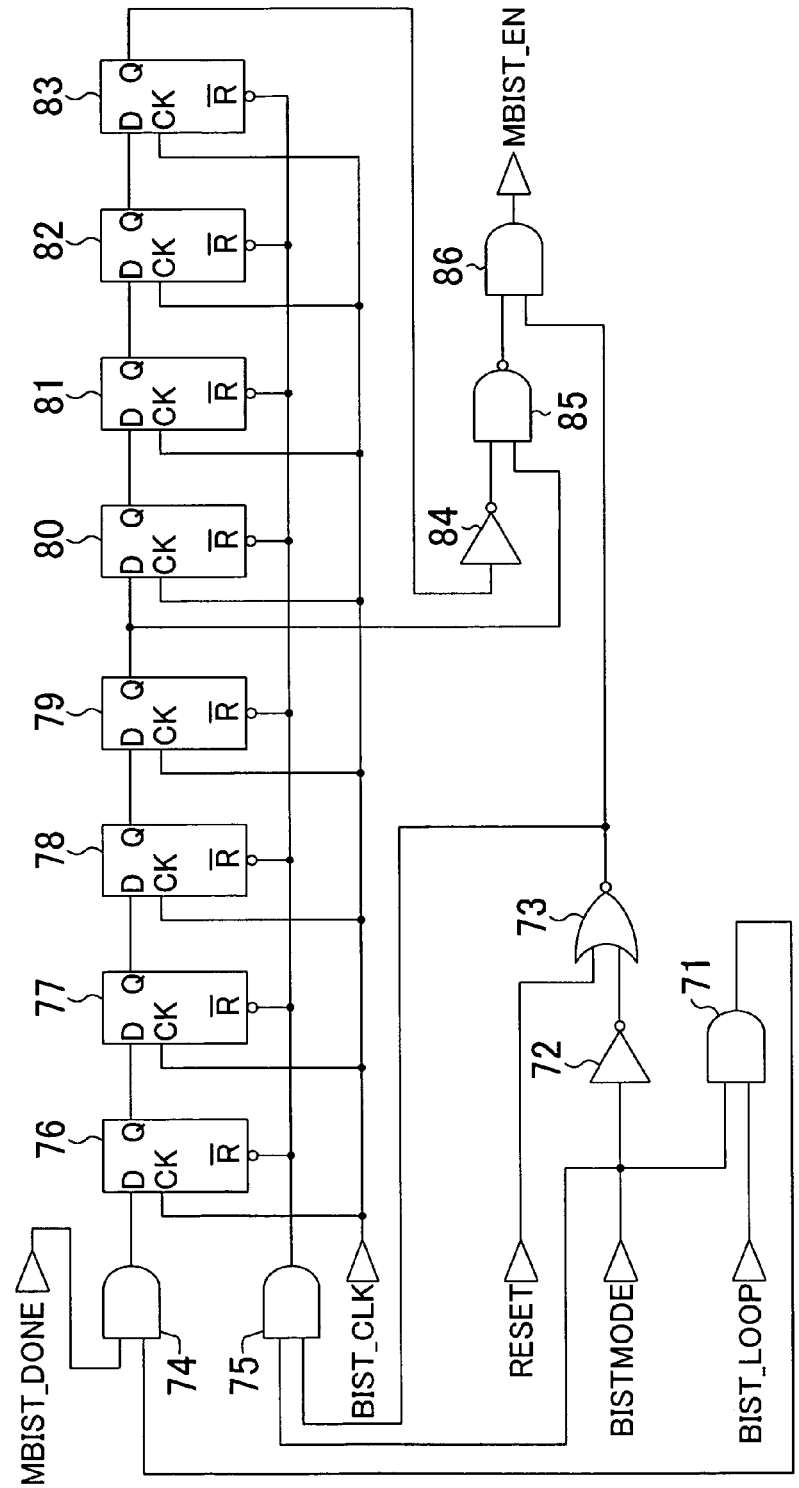
FIG. 12 is a diagram illustrating the circuit configuration of a fifth circuit block shown in FIG. 8.

FIG. 12 is a diagram illustrating the circuit configuration of the fifth circuit block 35. The fifth circuit block 35 includes input terminals BIST_CLK, BISTMODE, BIST_LOOP, RESET, and MBIST_DONE and an output terminal MBIST_EN. In the fifth circuit block 35, a plurality of logic elements form a combinational circuit. In FIG. 12, the reference numerals 71, 74, 75, and 86 refer to AND elements; 72 and 84 to inverter elements; 73 to a NOR element; 76, 77, 78, 79, 80, 81, 82, and 83 to reset-equipped D flip flops: and 85 to a NAND element. A clock signal of a specific frequency is input into the BIST_CLK terminal, while signals maintaining the following certain relations are input into the RESET terminal and the MBIST_DONE terminal. An "H" pulse signal having a specific width is input into the RESET terminal, when the MBIST_DONE terminal is in the "L" state, while an "H" pulse signal having a specific width is input into the MBIST_DONE terminal, when the RESET terminal is in the "L" state. When BISTMODE is in the "L" state, MBIST_EN is always in the "L" state irrespective of the logics of BIST_LOOP, RESET, and MBIST_DONE. When BISTMODE is in the "H" state and BIST_LOOP is in the "L" state, MBIST_EN outputs the inverted logic signal of RESET irrespective of the logic of MBIST_DONE. When BISTMODE is in the "H" state and BIST_LOOP is in the "H" state, MBIST_EN outputs a signal indicating a specific logic which is determined by RESET, MBIST_DONE and the clock terminal BIST_CLK. The MBIST_EN signal changes from "H" to "L", when a specific clock cycle has elapsed from the rising edge of the MBIST_DONE signal. Also, the MBIST_DONE signal changes from "H" to "L", when a specific clock cycle has elapsed from the falling edge of the MBIST_EN signal. The timing relation for the latter is determined by the BIST circuit 500.

Figure 13:
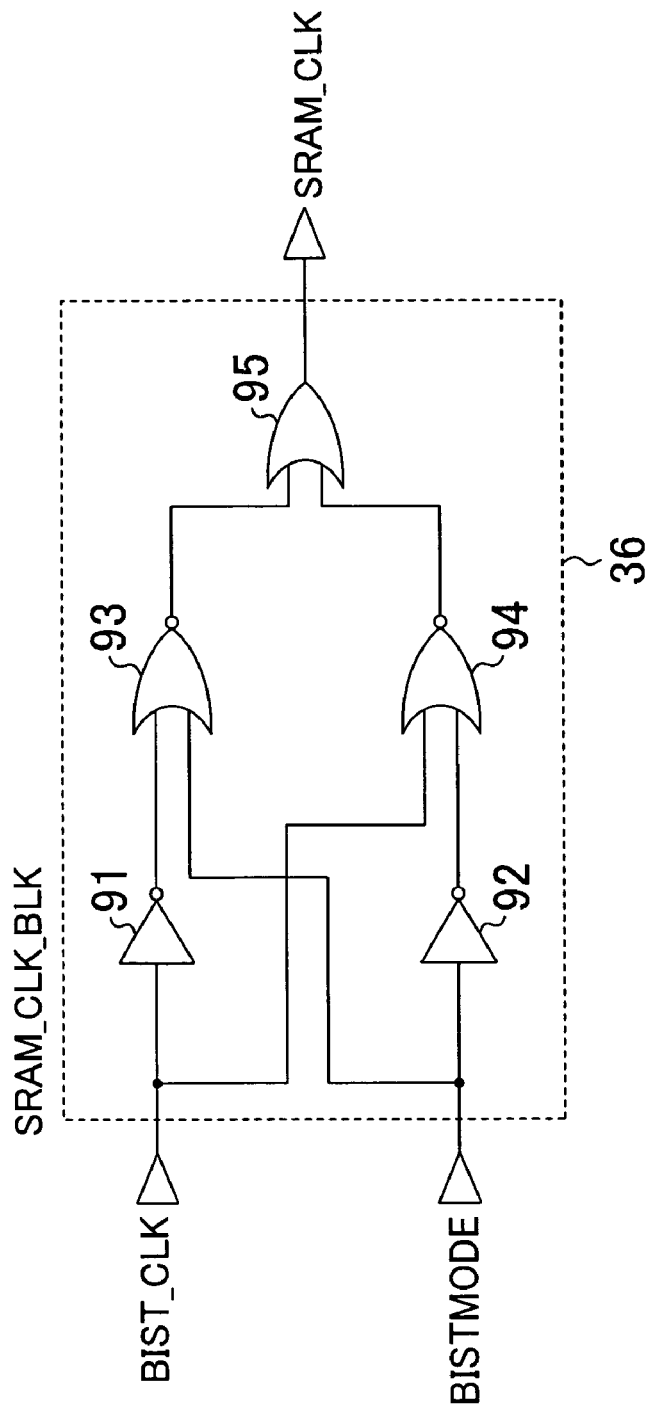
FIG. 13 is a diagram illustrating the circuit configuration of a sixth circuit block shown in FIG. 8.

FIG. 13 is a diagram illustrating the circuit configuration of the sixth circuit block 36. The sixth circuit block 36 includes input terminals BISTMODE and BIST_CLK and an output terminal SRAM_CLK. In the sixth circuit block 36, a plurality of logic elements form a combinational circuit. In FIG. 13, the reference numerals 91 and 92 refer to inverter elements; 93 and 94 to NOR elements, and 95 to an OR element. When BISTMODE is in the "L" state, SRAM_CLK outputs a signal indicating the same logic as BIST_CLK. When BISTMODE is in the "H" state, SRAM_CLK outputs the inverted logic signal of BIST_CLK.

FIG. 14 is a logic chart for the external input/output signal terminals in the circuit configurations shown in FIGS. 5 to 8. The numerals (1) to (4) shown in the upper portion in the logic chart represent mode segments provided for purposes of explanation. In the chart, the terminal names in the "input" section are the same as those in the "output" section, which means that the "input" section shows by what logic each terminal is externally controlled and the "output" section shows what logic state each terminal is in at the time of the external control.

The mode segment (1) indicates a case where the semiconductor integrated circuit device is put in standby mode. In this case, it is desirable that control can be exercised by a minimum number of control terminals. This is because, for example, when an abnormal condition occurring in the standby current is analyzed using a failure analysis device in which liquid crystal is used, it is very difficult to fix a plurality of control terminals at specific logics.

Therefore, in the mode segment (1), the STB1P_PAD terminal is externally fixed in the "H" state and the other terminals are put in the "Z" state, i.e., in the open state. The logic states of the respective terminals in this case are as shown in the "output" section; only the STB1P_PAD terminal is in the "H" state and the other terminals are in the "L" state. To be specific, it is indicated that the circuit configuration in the semiconductor integrated circuit device allows the logics of the other terminals to be fixed just by fixing only the STB1P_PAD terminal, even if the other terminals are in the open state. By this configuration, it is possible to put the chip (the semiconductor integrated circuit device) in the standby mode just by externally fixing the STB1P_PAD terminal alone.

The mode segment (2) indicates a case in which the semiconductor integrated circuit device is performing an operation, which is a BIST operation, and is in a WLBI state. In this case, it is also desirable that control can be exercised by a minimum number of control terminals, because of the following reasons. A WLBI test is a process in which a plurality of semiconductor integrated circuit devices (chips) formed on the same wafer are simultaneously and continuously operated for a specified length of time so as to remove early failures from the semiconductor integrated circuit devices. Due to limitations on the WLBI system, the number of probe terminals available per wafer is restricted. Therefore, as the number of probe terminals required per chip is decreased, the number of chips that can be simultaneously subjected to the WLBI test is increased.

More specifically, the mode segment (2) means a WLBI operation state in which BIST loop function is used. The "BIST loop function" is a function in which upon completion of a series of BIST operations, the completion signal thereof (MBIST_DONE) is detected within the chip and a self-test start signal (MBIST_EN) is automatically generated within the chip, whereby the BIST operation is repeated a specified number of times.

Therefore, the mode segment (2) indicates a case in which the BISTMODE_PAD terminal is fixed in the "H" state, any combination of "L", "Z", and "H" is applicable to the logics of the NOE1_PAD and NOE2_PAD terminals, and the other terminals are in the "Z" state. The logic states of the respective terminals in this case are as shown in the "output" section; the STB1P_PAD terminal is in the "L" state, the BISTMODE_PAD terminal is in the "H" state, each of the NOE1_PAD terminal and the NOE2_PAD terminal is in the same state as the input logic thereof, the AD0_NW_PAD terminal is in the "L" state, the AD17_PAD terminal is in the "L" state, and the logic of the DIO0_GO_PAD terminal is skillfully determined by the combination of the logics of the NOE1_PAD and NOE2_PAD terminals and the logic of an internal signal not shown in FIG. 14 and can be any of the states "L", "H", "Z" and "X". In FIG. 14, when the NOE1_PAD terminal and the NOE2_PAD terminal are both in the "L" state, the output logic of the DIO0_GO_PAD terminal is "L", but this output logic may be "H" depending upon the logic of the internal signal. The DIO15_PAD terminal is in the "L" state, the CLK_PAD terminal is in the "Z" state, and the RESET_PAD terminal is in the "Z" state.

In FIG. 14, the input/output terminals whose output logic is "Z" mean that signal input by external connection is required. With this configuration, it is possible to put the chip (the semiconductor integrated circuit device) in the WLBI operation state just by externally controlling the minimum number of external terminals.

The mode segment (3) indicates a case in which the semiconductor integrated circuit device is performing an operation, which is a BIST operation, and is in a test and analysis state. In this case, a relatively large number of control terminals are necessary, because of the following reasons. For example, when a confirmatory test of whether or not a WLBI test in the BIST operation is properly functioning is performed or when a test in various analysis modes other than the WLBI test using the BIST operation is performed, a high degree of control using an LSI tester capable of controlling a plurality of control terminals is required for each chip. The mode segment (3) indicates a test and analysis state and includes a test of whether or not the BIST function and the BIST loop function run properly.

The mode segment (3) therefore indicates the "test and analysis of BIST & WLBI operation" state. When the semiconductor integrated circuit device is put in the mode segment (2) as a result of performing a certain terminal setting such as by setting the BISTMODE_PAD terminal in the "H" state, the AD0_NW_PAD terminal and the AD17_PAD terminal are both fixed in the "L" state by internal control. This is preferable for the mode segment (2) in which control by the minimum number of external control terminals is required. In this state, if the AD0_NW_PAD terminal is externally forced to go to the "H" state, the AD17_PAD terminal goes to the "Z" (open) state, so that the logic thereof can be externally controlled in an optimal manner. This is preferable for the mode segment (3) in which control by a relatively large number of external control terminals is required. It should be noted that in an actual device, there are a plurality of address input terminals AD1_PAD to AD16_PAD which are controlled in the same manner as AD17_PAD.

The mode segment (4) indicates a case in which the semiconductor integrated circuit device is performing an operation, which is a DMA operation, and is in a test and analysis state. In this case, a relatively large number of control terminals are also required, because of the following reasons. For example, when a confirmatory test of whether or not test result in a BIST operation agrees with test result in a DMA operation is performed or when a detailed test is performed in a DMA operation, a high degree of control using an LSI tester capable of controlling a plurality of control terminals is required for each chip.

Therefore, the mode segment (4) indicates a case in which the BISTMODE_PAD terminal is fixed in the "L" state, any combination of "L", "Z", and "H" is applicable to the logics of the NOE1_PAD and NOE2_PAD terminals, and the other terminals are in the "Z" state. The logic states of the respective terminals in this case are as shown in the "output" section; the STB1P_PAD terminal is in the "L" state, the BISTMODE_PAD terminal is in the "L" state, each of the NOE1_PAD terminal and the NOE2_PAD terminal is in the same state as the input logic thereof, the AD0_NW_PAD terminal is in the "Z" state, the AD17_PAD terminal is in the "Z" state, and the logics of the DIO0_GO_PAD and DIO15_PAD terminals are skillfully determined by the logic of the NOE1_PAD terminal and the logic of an internal signal not shown in FIG. 14 and can be any of the states "L", "H", "Z" and "X". In FIG. 14, when the NOE1_PAD terminal is in the "L" state, the output logics of the DIO0_GO_PAD and DIO15_PAD terminals are "L", but these output logics may be "H" depending upon the logic of the internal signal. The CLK_PAD terminal is in the "Z" state, and the RESET_PAD terminal is in the "Z" state. It is also indicated that the logic of the NOE2_PAD terminal does not influence the logics of any other external terminals.

In FIG. 14, the input/output terminals whose output logic is "Z" mean that signal input by external connection is required. By this configuration, many external terminals are put in the open state so as to be controlled externally, thereby allowing the chip (the semiconductor integrated circuit device) to perform an operation other than the WLBI test, whereby various operation verifications can be conducted.

As described above, in this embodiment, it is possible to skillfully set the logic of the external input/output signal terminal 5, which is externally controlled by the plurality of operation modes or by the standby mode, and the logic of the external input/output signal terminal 6, which is not controlled externally. Also, the address signal input terminal 5, which is not usually necessary in the operation mode in which self-test function is used, can be used as a sub-operation mode setting terminal in the operation mode in which self-test function is used. This allows the external input/output signal terminal 5 to be used as a plurality of functional terminals, whereby the number of external input/output signal terminals required for function settings can be reduced.

Figure 15:
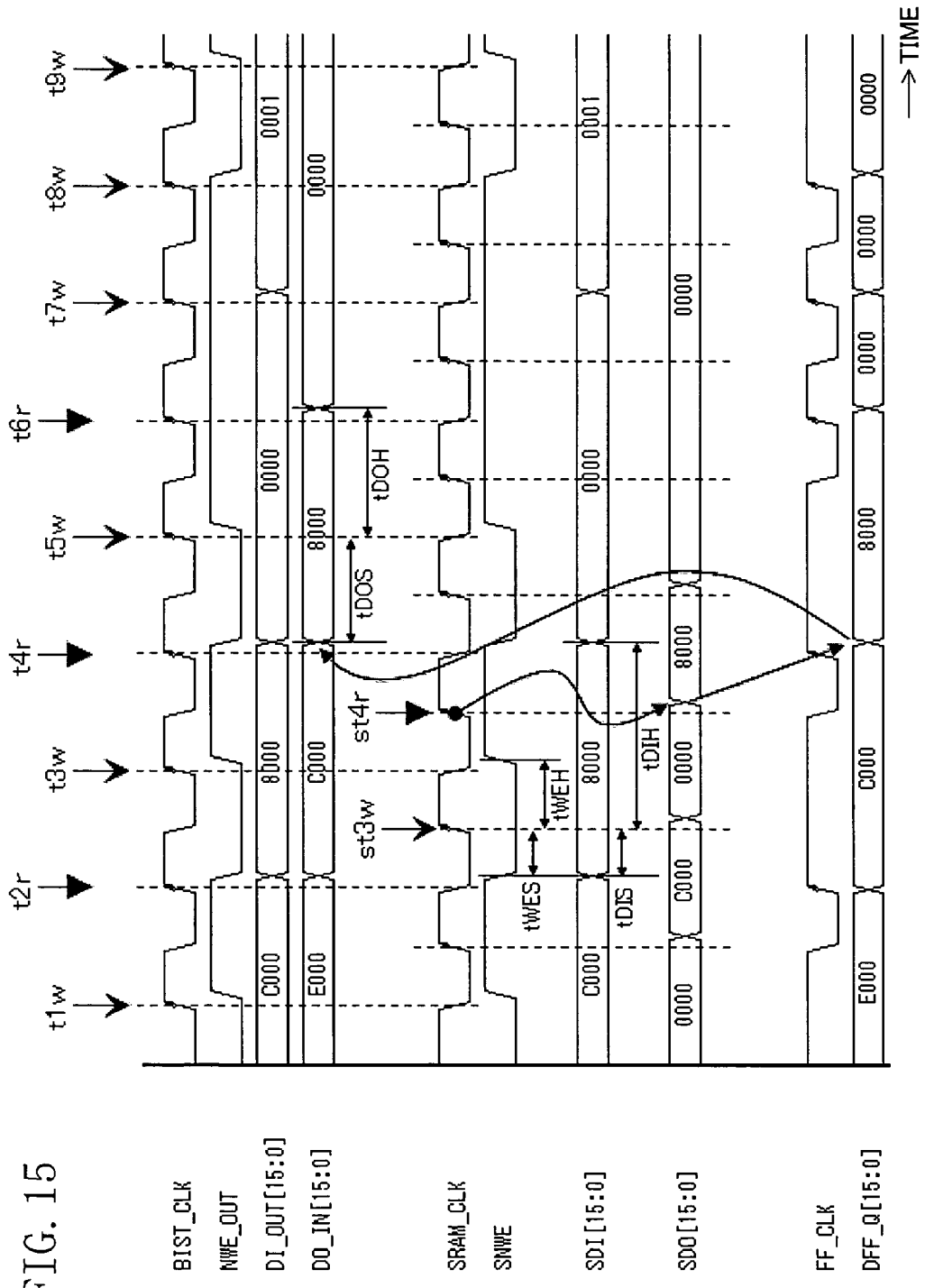
FIG. 15 is an operation timing chart in the circuit configuration shown in FIG. 1.

FIG. 15 is a timing chart in the circuit configuration shown in FIG. 1 and indicates timings for the signals that are input into and output from the BIST circuit 500, the memory macro 400, and the DFF circuit 420. The sets of characters shown together with the down arrows above the BIST_CLK signal and the SRAM_CLK signal indicate the timings of the rising edges of these clock signals. An endmost character "w" indicates the timing of the issuance of a write command and an endmost character "r" indicates the timing of the issuance of a read command. The characters tDOS shown under the waveform of the DO_IN[15:0] signal indicate the setup time margin of the DO_IN[15:0] signal which is input into the BIST circuit 500, and the characters tDOH indicate the hold time margin of the DO_IN[15:0] signal which is input into the BIST circuit 500. The characters tWES shown under the waveform of the SNWE signal indicate the setup time margin of the SNWE signal which is input into the memory macro 400, and the characters tWEH indicate the hold time margin of the SNWE signal which is input into the memory macro 400. The characters tDIS shown under the waveform of the SDI[15:0] signal indicate the setup time margin of the SDI[15:0] signal which is input into the memory macro 400, and the characters tDIH indicate the hold time margin of the SDI[15:0] signal which is input into the memory macro 400.

Timing of transfer of the signals will be described below. The BIST_CLK signal and the SRAM_CLK signal are in inverse logic relationship, and a write command issued at time t3w from the BIST circuit 500 is received by the memory macro 400 at time st3w, which is one-half clock cycle earlier than the time t3w. The NWE_OUT signal and the DI_OUT [15:0] signal are generated from the BIST circuit 500 in accordance with the rising edge of the BIST_CLK signal and input into the memory macro 400 as the SNWE signal and the SDI[15:0] signal, respectively. A sufficient margin almost equal to or longer than one-half of a clock cycle time is allocated to each of the time margins tWES, tWEH, tDIS, and tDIH for the respective signals that are input into the memory macro 400.

Next, the data written into the memory macro 400 by the write command issued at the time t3w from the BIST circuit 500 begins to be read by a read command issued at time t4r at which the rising edge of the BIST_CLK's next cycle occurs. The read command issued at the time t4r from the BIST circuit 500 is received by the memory macro 400 at time st4r that is one-half clock cycle earlier than the time t4r. After a delay, which is equal to the SRAM access time, from the time st4r, data SDO[15:0] is output. Latched data DFF_Q[15:0] from the data SDO[15:0] is output at the rising edge of the FF_CLK signal, and is input into DO_IN[15:0] in the BIST circuit 500. For DO_IN[15:0] input into the BIST circuit 500, a PASS/FAIL decision is made at time t5w. A sufficient margin almost equal to one clock cycle time is allocated to each of the time margins tDOS and tDOH.

As described above, in the operation mode in which self-test function is used, the semiconductor integrated circuit device performs the operation while maintaining the time margins that ensure the signal transfers between the memory macro 400 and the BIST circuit 500.

Figure 16:
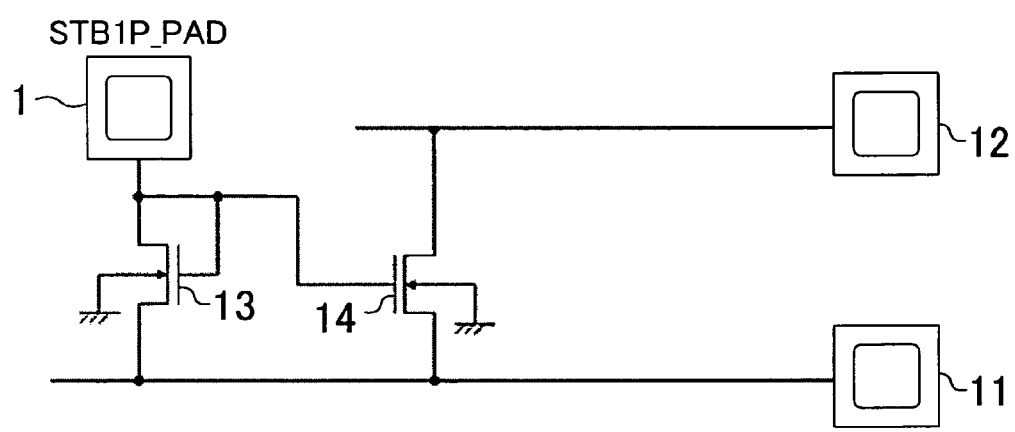
FIG. 16 is a circuit configuration diagram illustrating a modified example for power supply in the semiconductor integrated circuit device shown in FIG. 1.

FIG. 16 is a diagram illustrating the circuit configuration of the semiconductor integrated circuit device according to the embodiment of the present invention. The semiconductor integrated circuit device includes the external input/output signal terminal (STB1P_PAD: one-pin standby setting terminal) 1, a first power terminal 11, a second power terminal 12, a first NMOS transistor element 13, and a second NMOS transistor element 14. The external input/output signal terminal 1 is connected with the drain and gate of the first NMOS transistor element 13 and with the gate of the second NMOS transistor element 14. The source of the first NMOS transistor element 13 is connected with the source of the second NMOS transistor element 14 and with the first power terminal 11, while the potential of the substrate thereof is fixed to ground potential. The drain of the second nMOS transistor element 14 is connected to the second power terminal 12, while the potential of the substrate thereof is fixed to the ground potential.

To put the semiconductor integrated circuit device in the standby mode, the external input/output signal terminal 1 is set in the "H" state and the first and second power terminals 11 and 12 are set in the "open" state. The semiconductor integrated circuit device includes a ground terminal which is not shown in FIG. 16, and the ground terminal is set at the ground potential by external connection. When the external input/output signal terminal 1 is set in the "H" state, the first and second nMOS transistor elements 13 and 14 both turn on, whereby the "H" potential supplied from the external input/output signal terminal 1 is transmitted to the power wire connected to the first power terminal 11 and to the power wire connected to the second power terminal 12. In other words, the external input/output signal terminal 1 also functions as a power supply terminal.

When the semiconductor integrated circuit device operates, the external input/output signal terminal 1 is set in the "L" state by an internal circuit in the semiconductor integrated circuit device and power is supplied from each of the first and second power terminals 11 and 12. The ground terminal in the semiconductor integrated circuit device is set at the ground potential by external connection. When the external input/output signal terminal 1 is set in the "L" state, the first and second nMOS transistor elements 13 and 14 both turn off, whereby the external input/output signal terminal 1, the first power terminal 11 and the second power terminal 12 become independent terminals which are electrically separated from each other.

As described above, in the configuration shown in FIG. 16, the semiconductor integrated circuit device can be set in the standby mode just by applying a specific potential to the standby setting terminal 1.

As described in the foregoing, according to the present invention, the number of externally controlled input/output terminals can be controlled optimally in accordance with a plurality of operation modes or standby mode. Therefore, in a test focusing on operation inside a memory macro, a test can be conducted in an operation in which factors causing the occurrence of malfunctions outside the memory macro are reduced, and test and analysis and the like in each test mode can thus be performed easily and efficiently. The present invention is therefore effectively applicable to methods for simplifying test and analysis of semiconductor integrated circuit devices.

What is claimed is:

1. A semiconductor integrated circuit device comprising:
 a plurality of external input/output signal terminals;
 a plurality of unit input/output circuits accompanying the respective external input/output signal terminals;
 one or more memory macros;
 a self-testing block for performing a self test of the one or more memory macros within a chip;
 a plurality of circuit blocks for generating various control signals; and
 means into which a first mode setting control signal output from a specific one of the unit input/output circuits is input as a control signal for controlling other two or more of the unit input/output circuits and which generates a main operation mode setting signal in accordance with OR logic of the first mode setting control signal and a second mode setting control signal output from a different specific one of the unit input/output circuits into which the first mode setting control signal has been input,
 wherein the unit input/output circuits are individually controlled by the various control signals and the main operation mode setting signal is an internal setting signal for setting whether or not the semiconductor integrated circuit device is in an operation mode in which self-test function is used.

2. The device of claim 1,
 wherein the first mode setting control signal is a signal for setting whether the semiconductor integrated circuit device is in a standby mode or in an operation mode; and
 the second mode setting control signal is a preset signal for setting whether or not the semiconductor integrated circuit device is in the operation mode in which the self-test function is used.

3. The device of claim 2, comprising means into which the main operation mode setting signal is input as a control signal for controlling a specific one of the unit input/output circuits and which generates a sub-operation mode setting signal in accordance with combined logic of the main operation mode setting signal and a third mode setting control signal output from the specific unit input/output circuit,
 wherein the third mode setting control signal is a preset signal for setting whether or not the semiconductor integrated circuit device is in a wafer level burn-in (WLBI) mode; and
 the sub-operation mode setting signal is an internal setting signal for setting whether or not the semiconductor integrated circuit device is in the WLBI mode.

4. The device of claim 3, comprising means into which the sub-operation mode setting signal is input as a control signal for controlling a specific one of the unit input/output circuits and which generates an input enable signal, which is input into a different specific one of the unit input/output circuits, in accordance with combined logic of the sub- operation mode setting signal, the main operation mode setting signal, and an internal logic signal.

5. The device of claim 3, comprising means for generating a plurality of internal logic signals, which are input into two or more of the unit input/output circuits, and a control signal for controlling repeated operation of the self-testing block, in accordance wit combined logic of a first data input/output control signal, a second data input/output control signal, the main operation mode setting signal, and the sub-operation mode setting signal, the first data input/output control signal being output from a specific one of the unit input/output circuits, the second data input/output control signal being output from a different specific one of the unit input/output circuits.

6. The device of claim 5, comprising means for generating a self-test start signal for the self-testing block in accordance with combined logic of the self-testing block's repeated operation control signal, the main operation mode setting signal, a reset signal output from a specific one of the unit input/output circuits, a self-test completion signal generated from the self-testing block, and a first clock signal output from a different specific one of the unit input/output circuits.

7. The device of claim 6, comprising means for generating a second clock signal, which is input into the memory macro, in accordance with combined logic of the first clock signal and the main operation mode setting signal.

8. The device of claim 7, wherein when the semiconductor integrated circuit device is in the operation mode in which the self-test function is used, the first and second clock signals are in inverse logic relationship to each other; and
 when the semiconductor integrated circuit device is in an operation mode in which the self-test function is not used, the first and second clock signals are in the same logic relationship.

9. The device of claim 8, wherein a plurality of data output signals from the memory macro are each input into the self testing block through a data latch circuit;
 the first clock signal is connected with a clock input terminal of the self-testing block;
 the second clock signal is connected with a clock input terminal of the memory macro; and
 a NAND logic signal of the second clock signal and a write control signal is connected with a clock input terminal of the data latch circuit, the write control signal being connected with a write control terminal of the memory macro.

10. The device of claim 3, wherein by setting a specific one of the external input/output signal terminals to logic "H" or "L" by first external control, other two or more of the external input/output signal terminals are set to the logic "H" or "L" by internal control; and by forcibly setting, in this state, one of the external input/output signal terminals that have been set to the logic "H" or "L" by the internal control to inverse logic by second external control, the others of the external input/output signal terminals that have been set to the logic "H" or "L" by the internal control is set in a "Z" (open) state.

11. The device of claim 10, wherein the external input/output signal terminal that is forcibly set to the inverse logic by the external control is connected with the unit input/output circuit that outputs the third mode setting control signal, and in a first main operation mode, this external input/output signal terminal has a function for setting a specific sub-operation mode, and in a second main operation mode, has a function as an input terminal for a specific address signal.

12. The device of claim 1, wherein the specific one of the external input/output signal terminals is a standby setting terminal and connected with a drain and a gate of a first nMOS transistor element and with a gate of a second nMOS transistor element, a source of the first nMOS transistor element is connected with a source of the second nMOS transistor element and with a first power terminal, a substrate of the first nMOS transistor element is fixed to ground potential, a drain of the second nMOS transistor element is connected with a second power terminal, and a substrate of the second nMOS transistor element is fixed to the ground potential.

13. The device of claim 12, wherein when the semiconductor integrated circuit device is put in a standby mode, the standby setting terminal is set to "H" by external control and the first and second power terminals are set to "open"; and when the semiconductor integrated circuit device operates, the standby setting terminal is set to "L" by an internal circuit in the semiconductor integrated circuit device and power is supplied from each of the first and second power terminals.

* * * * *